United States Patent
Baek et al.

(10) Patent No.: US 9,622,364 B2
(45) Date of Patent: Apr. 11, 2017

(54) ELECTRONIC DEVICE INCLUDING CARD TRAY

(71) Applicant: Samsung Electronics Co., Ltd., Gyeonggi-do (KR)

(72) Inventors: Sang-In Baek, Gyeonggi-do (KR); Kwang-Jin Bae, Gyeonggi-do (KR); Soon-Woong Yang, Gyeonggi-do (KR); Hong-Moon Chun, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 120 days.

(21) Appl. No.: 14/624,735

(22) Filed: Feb. 18, 2015

(65) Prior Publication Data

US 2015/0245515 A1    Aug. 27, 2015

(30) Foreign Application Priority Data

Feb. 21, 2014    (KR) .................. 10-2014-0020960

(51) Int. Cl.
  *G06F 1/16*    (2006.01)
  *H05K 5/02*    (2006.01)

(52) U.S. Cl.
  CPC ......... *H05K 5/0286* (2013.01); *G06F 1/1613* (2013.01); *G06F 1/1658* (2013.01); *H05K 5/0221* (2013.01); *H05K 5/0226* (2013.01)

(58) Field of Classification Search
  CPC ... H05K 5/0286; H05K 5/0295; G06F 1/1656
  See application file for complete search history.

(56) References Cited

U.S. PATENT DOCUMENTS

| 4,975,805 | A | * | 12/1990 | Schmutzler | .......... | H05K 7/1411 |
|||||||360/99.02|
| 5,383,789 | A | * | 1/1995 | Watanabe | ............ | H01R 13/633 |
|||||||361/754|
| 5,600,539 | A | * | 2/1997 | Heys, Jr. | ................... | G06F 1/16 |
|||||||361/679.32|
| 5,889,649 | A | * | 3/1999 | Nabetani | .............. | G06K 7/0082 |
|||||||361/679.32|
| 7,125,258 | B2 | * | 10/2006 | Nakakubo | ........ | G06K 19/07741 |
|||||||439/328|
| 8,462,512 | B2 | * | 6/2013 | Zhang | .................. | H04B 1/3816 |
|||||||361/737|

(Continued)

FOREIGN PATENT DOCUMENTS

JP          2014-7094 A      1/2014
KR    10-2012-0013509 A      2/2012

(Continued)

*Primary Examiner* — Anthony Q Edwards
(74) *Attorney, Agent, or Firm* — Cha & Reiter, LLC.

(57) ABSTRACT

An electronic device is provided which may include a tray, an exterior cover, and/or a first hooking structure. The tray may be inserted or drawn to or from an inside via an opening of a housing of the electronic device, and may include a space for receiving a card. The exterior cover may be movably coupled to the tray. The first hooking structure may be disposed inside the electronic device, and may maintain a closed state of the exterior cover, and may release the closed state of the exterior cover in response to pressing of the exterior cover.

23 Claims, 20 Drawing Sheets

(56) References Cited

U.S. PATENT DOCUMENTS

| | | | | |
|---|---|---|---|---|
| 8,625,287 B2* | 1/2014 | Liu | ............... | G06K 13/0818 |
| | | | | 361/726 |
| 8,897,004 B2* | 11/2014 | Ruch | ............... | G06F 1/1632 |
| | | | | 312/293.1 |
| 9,164,539 B2* | 10/2015 | Wu | ............... | G06F 1/1613 |
| 9,311,571 B2* | 4/2016 | Lei | ............... | G06K 13/0812 |
| 9,350,833 B2* | 5/2016 | Li | ............... | G06F 1/1613 |
| 9,389,639 B2* | 7/2016 | Yoon | ............... | H04M 1/236 |
| 2008/0096606 A1 | 4/2008 | Park et al. | | |
| 2010/0073891 A1* | 3/2010 | Chen | ............... | H04M 1/026 |
| | | | | 361/759 |
| 2013/0005166 A1 | 1/2013 | Lim et al. | | |
| 2013/0023136 A1 | 1/2013 | Kim et al. | | |
| 2013/0115796 A1* | 5/2013 | Liu | ............... | G06K 7/0021 |
| | | | | 439/325 |
| 2013/0240629 A1* | 9/2013 | Pesonen | ............... | H04B 1/3816 |
| | | | | 235/486 |
| 2013/0314854 A1* | 11/2013 | Chung | ............... | H05K 5/0239 |
| | | | | 361/679.01 |
| 2014/0029211 A1* | 1/2014 | Gao | ............... | H05K 5/0091 |
| | | | | 361/747 |
| 2014/0247568 A1* | 9/2014 | Lin | ............... | H04B 1/3818 |
| | | | | 361/754 |

FOREIGN PATENT DOCUMENTS

| | | |
|---|---|---|
| KR | 10-2013-0006849 A | 1/2013 |
| KR | 10-2013-0112185 A | 10/2013 |
| KR | 10-2013-0142085 A | 12/2013 |

* cited by examiner

ELECTRONIC DEVICE INCLUDING CARD TRAY

CROSS REFERENCE TO RELATED APPLICATION

This application claims the benefit under 35 U.S.C. §119 (a) of a Korean patent application filed in the Korean Intellectual Property Office on Feb. 21, 2014 and assigned Serial No. 10-2014-0020960, the entire disclosure of which is hereby incorporated by reference.

BACKGROUND

1. Technical Field

The present disclosure relates to a portable electronic device. More particularly, the present disclosure relates to a card tray where a card is received and allowing the received cared to be inserted or drawn in an electronic device.

2. Description of the Related Art

An identification module is provided to an electronic device, for example, a mobile communication terminal. The identification module is a chip or a card that stores various information for authenticating a user's right. The identification module includes a module such as a user identification module (UIM), a subscriber identification module (SIM), and a universal subscriber identification module (USIM). Also, a mobile communication terminal may have a chip type SD card, etc. as a storage medium for extending a storage capacity.

For the above-listed identification module or SD card, etc., a detachable structure for inserting/drawing a card from a socket existing in a main body of a mobile communication terminal in a drawer manner is adopted. The detachable structure has an exterior cover for an exterior of the mobile communication terminal. The exterior cover opens/closes an opening for inserting/drawing a card to/from a socket of a terminal main body, and exists as a portion of the exterior of the mobile communication terminal.

As an example of the conventional card attachment/detachment structure, the exterior cover is mounted on an opening (an entry to which a card is inserted) of an electronic device, and a card is attached/detached by a tray in which the card has been received in a drawer manner.

However, the conventional card attachment/detachment structure has an inconvenience of having to fit it in an exterior cover using a tool and then take out a tray.

SUMMARY

In an embodiment, an exterior cover for card attachment/detachment in an electronic device may be configured to inhibit or prevent foreign substance from infiltrating into the inside of an electronic device. The cover may include a portion of an exterior of the electronic device, and may be formed of a structure that is conveniently attached/detached to/from the electronic device.

In an embodiment, a card tray apparatus that facilitates an operation of attaching/detaching a card to/from a main body by configuring an exterior cover in a tray shape inserted/drawn in a drawer manner.

In a further embodiment, a card tray apparatus may provide a convenience in attaching/detaching a card to/from a connection socket, and provide an elegant exterior design of an electronic device. A knob may facilitate inserting/drawing a card through the exterior even though the lateral side of the electronic device has a shape having a curvature. In an embodiment, the exterior cover may also function as a tray knob.

In a further embodiment, an apparatus may include: a card tray; an exterior cover including a hooking structure configured in an inside; and a retainer disposed inside the apparatus and supporting the card tray.

A card tray apparatus according to an embodiment of the present disclosure may include a locking structure or mechanism including an exterior cover hooking structure in a tray that receives a card. The hooking structure may be released as an exterior cover is pressed to release a closed state of the exterior cover. The locking structure or mechanism being transitionable between a closed state and an open state in response to, for example, pressing of the exterior cover.

As described above, a card tray apparatus according to an embodiment of the present disclosure configures an exterior cover in a tray shape inserted/drawn in a drawer manner, so that an operation of attaching/detaching a card to/from an electronic device is convenient.

Also, in a card tray apparatus according to an embodiment of the present disclosure, even though a lateral side of an electronic device has curvature, a knob for inserting/drawing a card is provided as an exterior, so that user convenience is raised.

These and other embodiments of the present disclosure will become apparent to those skilled in the art from the following detailed description, which, taken in conjunction with the annexed drawings, discloses exemplary embodiments of the disclosure.

BRIEF DESCRIPTION OF THE DRAWINGS

These and other aspects of the present disclosure will be more apparent from the following description taken in conjunction with the accompanying drawings in which.

DETAILED DESCRIPTION

Figure 1:
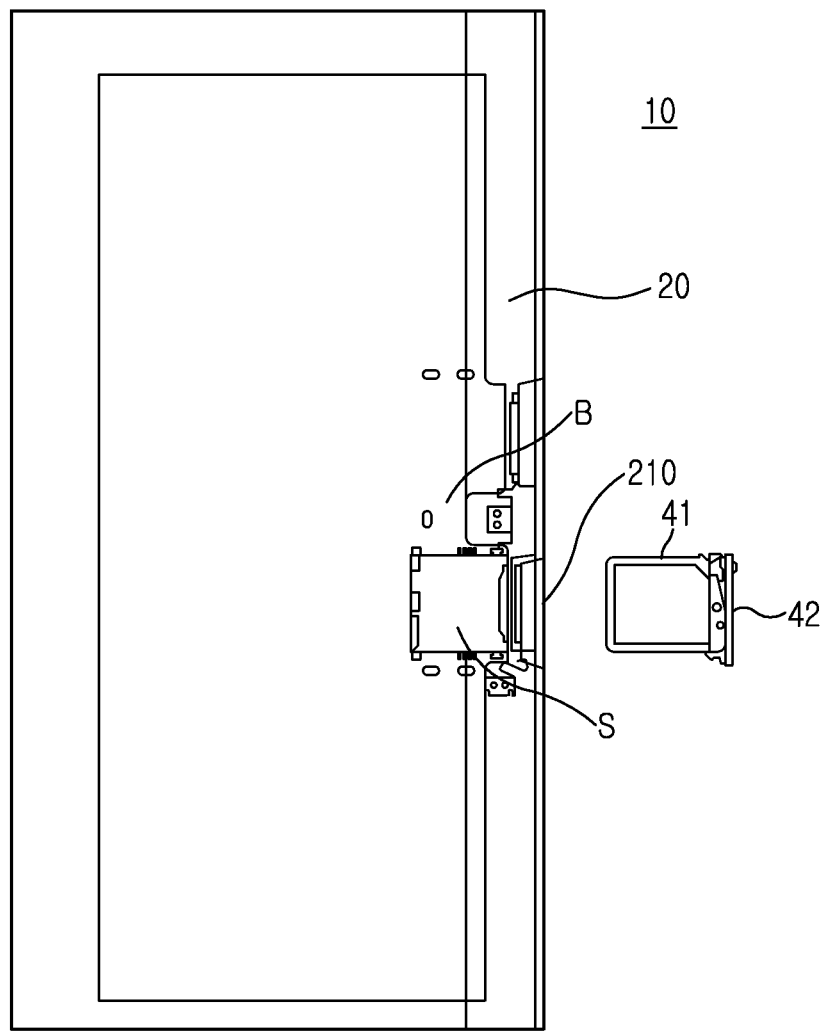
FIG. 1 is a back view of an electronic device to which a card tray apparatus has been applied according to an embodiments of the present disclosure.

The following description that refers to the accompanying drawings is provided to assist an overall understanding of embodiments according to the present disclosure as defined by appended claims and their equivalents. Also, a person of ordinary skill in the art would understand that various changes and modifications of embodiments described in the present specification may be made without departing from the scope and spirit of the present disclosure. Also, description of known functions and constructions is omitted for clarity and conciseness.

Hereinafter, various embodiments of the present disclosure are described with reference to the accompanying drawings. Like reference numerals denote like elements.

A construction of a card tray apparatus adopted to an electronic device according to various embodiments of the present disclosure is described. FIG. 1 is a perspective view of an electronic device to which a card tray apparatus has been adopted according to various embodiments of the present disclosure.

Referring to FIG. 1, the electronic device 10 to which a card tray module 40 has been adopted according to various embodiments of the present disclosure may include first and second housings 20, 30, a main board B disposed inside the first and second housings 20, 30, a card socket S connected to the main board B, and the card tray module 40 for inserting/drawing a card (not shown) to/from the card socket S. The card may include a module such as a user identification module (UIM), a subscriber identification module (SIM), a universal subscriber identification module (USIM), or a chip-shaped SD card as a storage medium for extending a storage capacity. The card tray module 40 may be a carry apparatus that may stably connect a card to a card socket S positioned inside an electronic housing, stably draw a connection-maintained card, or insert the card to the card socket S again. Particularly, the card tray module 40 may be an apparatus for facilitating card attachment/detachment in a tray type (drawer type), and making an exterior of an electronic device elegant while attaching/detaching a card even without a separate tool.

The card tray module 40 may be inserted/drawn from the electronic device in a drawer manner, and is not limited by a distance between a connection socket S and an opening 210 positioned in the board B even though curvature exists on a lateral side where the opening 210 of the electronic device is formed, and a knob for inserting/drawing a card is provided to an exterior, so that user convenience is raised.

Figure 2:
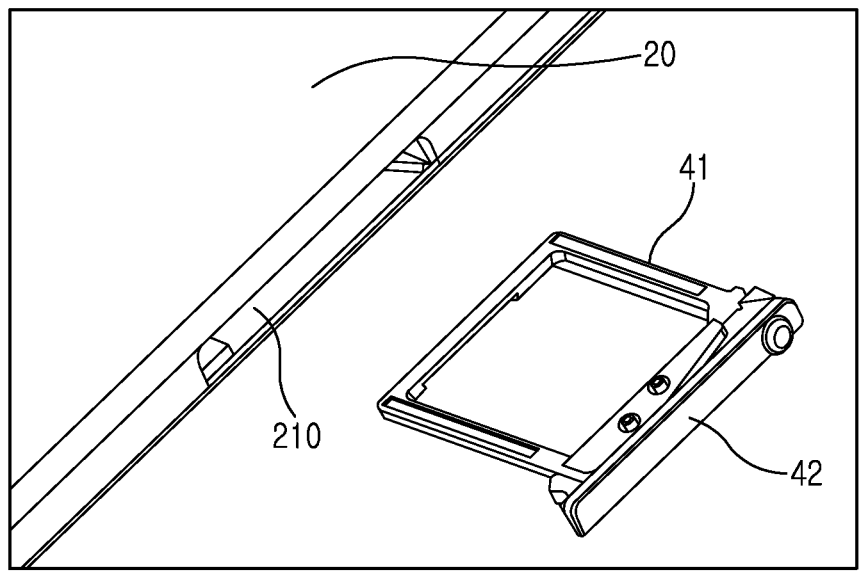
FIG. 2 is a partial perspective view illustrating an opening and a tray of a housing in a card tray according to an embodiment of the present disclosure.

Referring to FIG. 2, the card electronic device 10 according to an embodiment of the present disclosure may include the opening 210 formed in the housings 20, 30. The card tray 40 may be inserted to the opening 210. A USIM or a storage capacity medium card may be seated in the card tray module 40, and it may be seated in the card socket S together with the tray via the opening 210. The card tray module 40 is a tray shape inserted/drawn to/from the opening 210 in a drawer manner, and may be configured together with an exterior cover.

Figure 3:
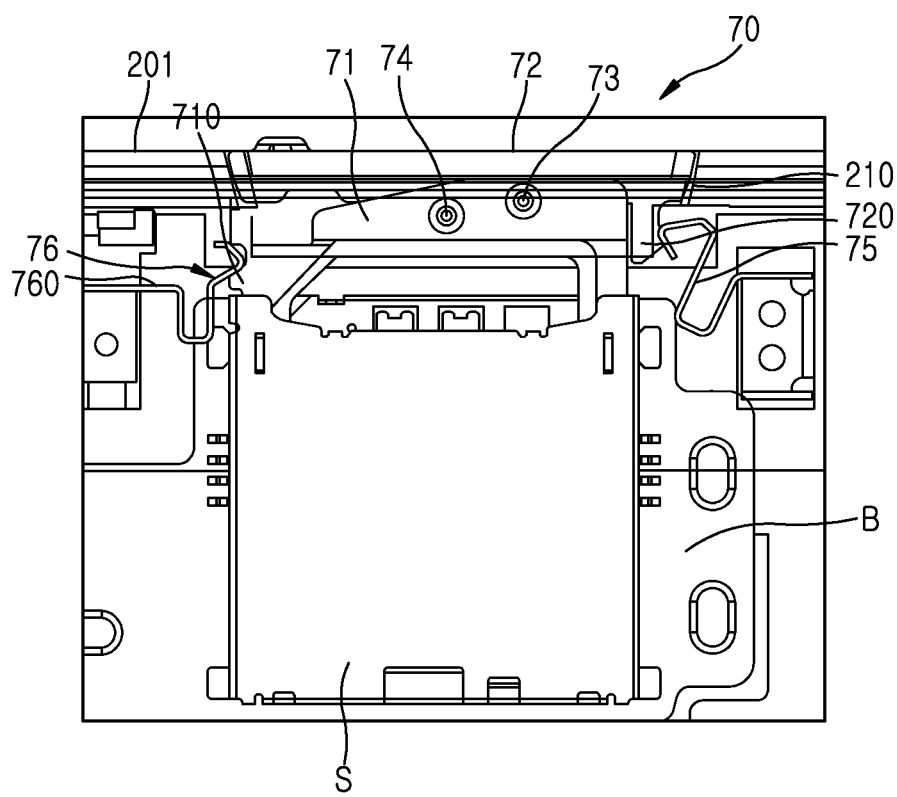
FIG. 3 is a top view of a card tray is seated on a socket according to various embodiments of the present disclosure.

A construction of a card tray apparatus adopted to an electronic device according to various embodiments of the present disclosure is described. FIG. 3 is a plan view illustrating a card tray seated on a connection socket according to various embodiments of the present disclosure. Also, FIG. 3 is a view illustrating a state where closing of a card tray module 70 has been maintained.

In describing a card tray apparatus according to an embodiment of the present disclosure with reference to the drawings, a plurality of embodiments of the present disclosure are applied to a portable electronic device. However, this is a general terminology, and it will be understood that the present embodiment is equally applicable to any of a mobile telephone, a palm sized personal computer (PC), a personal communication system (PCS), a personal digital assistant (PDA), a hand-held PC (HPC), a smartphone, a laptop computer, a netbook, a tablet PC, etc. Therefore, a terminology of a portable electronic device should not be used for limiting application of the present embodiment to a specific type of apparatus.

As illustrated in FIG. 3, the card tray apparatus 70 according to various embodiments of the present disclosure is a carry apparatus that may stably connect a card to a card socket S connected to a board B positioned inside a user housing, stably draw a connection-maintained card, or safely move the card so that the card may be inserted to the card socket S again. Particularly, the card tray apparatus 70 may facilitate card insertion/drawing in a tray type (a drawer manner), and making an exterior of an electronic device elegant while drawing a card even without a separate tool. The card may include a module such as a user identification module (UIM), a subscriber identification module (SIM), a universal subscriber identification module (USIM), or a chip-shaped SD card as a storage medium for extending a storage capacity.

The card tray module 70 may allow a card to be inserted/drawn from the electronic device in a drawer manner, and is not limited by a distance between a connection socket S and the opening 210 positioned in the board B even though curvature exists on a lateral side 201 where the opening 210 of the electronic device is formed.

Figure 4:
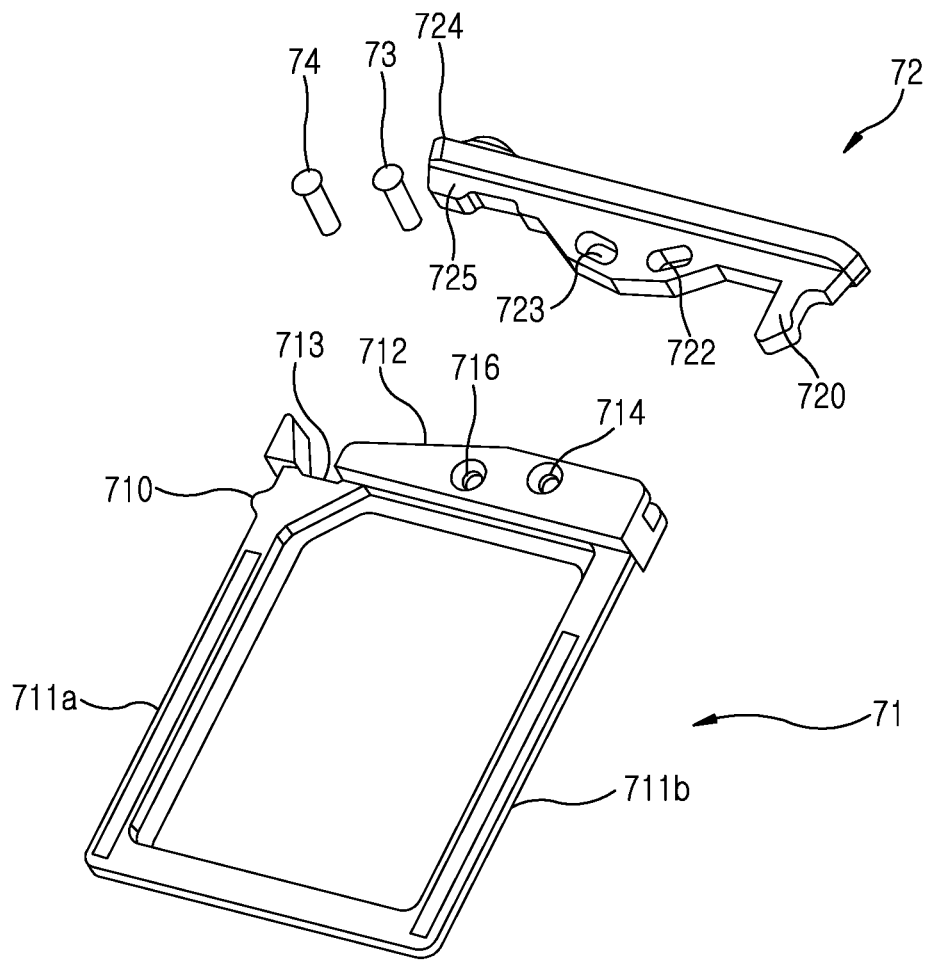
FIG. 4 is a perspective view illustrating a state where an exterior cover and a tray of a card tray apparatus are separated from each other according to an embodiment of the present disclosure.
Figure 5A:
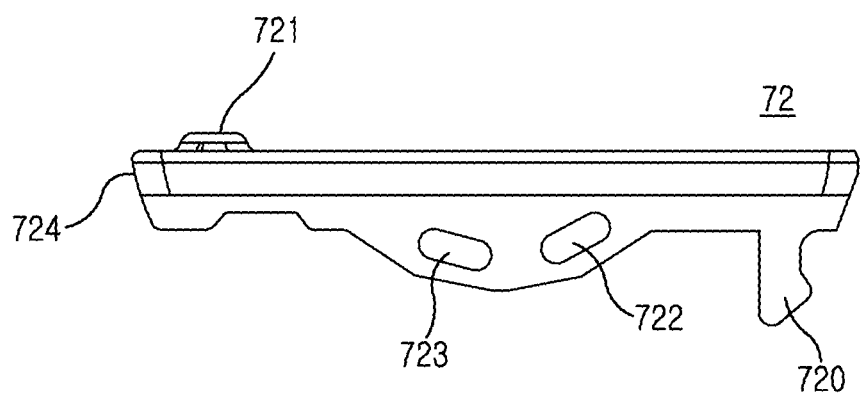
FIG. 5A is a side view of an exterior cover according to various embodiments of the present disclosure.
Figure 5B:
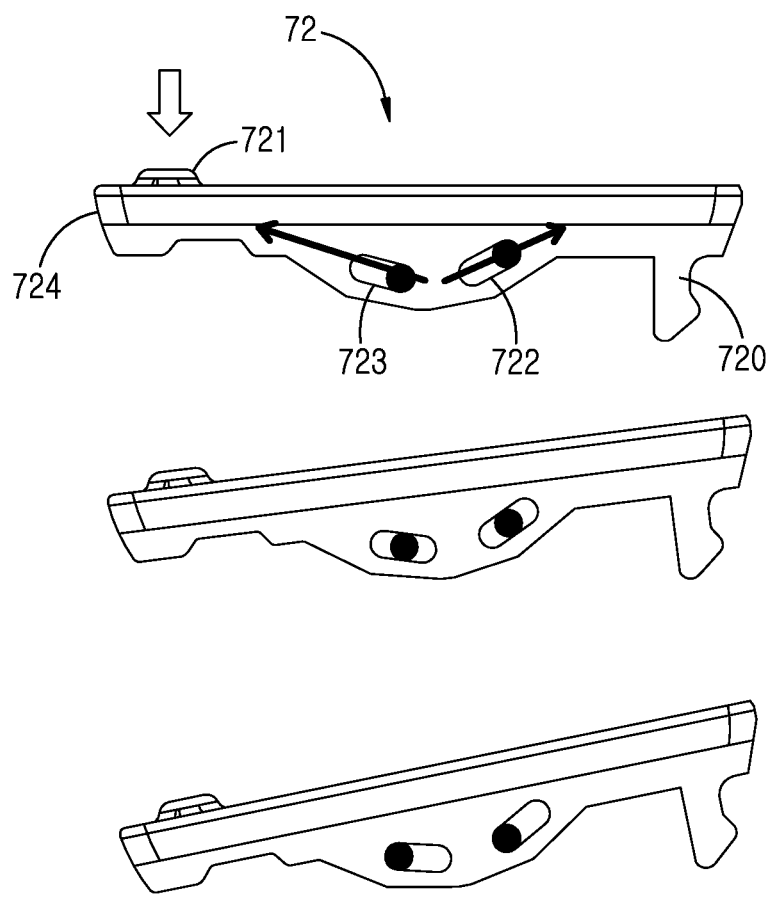
FIG. 5B is a view sequentially illustrating movement of an exterior cover according to an embodiment of the present disclosure.
Figure 5C:
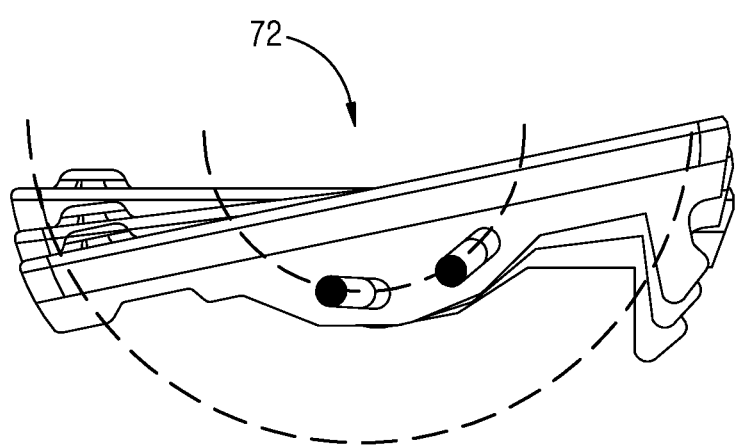
FIG. 5C is a view illustrating a trajectory of an exterior cover according to an embodiment of the present disclosure.

FIG. 4 is a perspective view illustrating a state where an exterior cover and a tray of a card tray apparatus are separated from each other according to various embodiments of the present disclosure. FIG. 5A is a plan view illustrating an exterior cover according to various embodiments of the present disclosure, FIG. 5B is a plan view sequentially illustrating movement of an exterior cover according to various embodiments of the present disclosure, and FIG. 5C is a plan view illustrating a trajectory of an exterior cover according to various embodiments of the present disclosure. A construction of a card tray apparatus adopted to an electronic device and movement of an exterior cover according to various embodiments are described.

The card tray module 70 according to an embodiment of the present disclosure may include a tray 71, an exterior cover 72, one or a plurality of hooking structures, and/or a retainer. In the present specification, a terminology of a "retainer" may be used mixed with other terminologies such as a binder, a binding tool, a connection tool, a hook, a hooking tool, etc. The card tray module 70 includes a first hooking structure for maintaining a closed state of the exterior cover 72, or releasing the closed state of the exterior cover 72 as the exterior cover 72 is pressed. In the present specification, the terminology of "exterior cover 72" may be used mixed with other terminologies such as a tray cover, a tray exterior, etc. Also, the card tray module 70 may additionally have a second hooking structure for maintaining a closed state of the tray 71. The first and second hooking structures are described later.

The tray 71 is a transfer member that safely receives a card and is inserted/drawn in a drawer manner to/from the electronic device together with the card. While the tray 71 is inserted/drawn, both side ends 711a, 711b of the tray may serve as guides.

The exterior cover 72 is connected to the tray 71 by a coupling structure to open/close the opening 210 provided to the electronic device while the tray is inserted/drawn. The exterior cover 72 moves such that it has a trajectory by a coupling structure. One end of the exterior cover 72 is a portion that is moved in the direction of a tray recess 713 by a user's pressing behavior, and the other end is a portion including the first hooking structure.

The coupling structure may include one or more openings (or recesses) 722, 723 formed in the exterior cover 72, and one or more coupling pins 73, 74 inserted to the opening and coupled to the tray 71.

The opening includes first and second openings 722, 723. The first and second openings 722, 723 may be formed with an interval or predetermined distances between the openings, and may be configured to have a long shape or long and bent curved shape. The openings 722, 723 may include the first opening formed long in a first direction, and the second opening formed long in a second direction different from the first direction. The opening may be configured in a shape that may or may not have curvature. The first direction and the second direction may form one of about 91 degrees to about 179 degrees. Also, the first direction and the second direction may form one of about 120 degrees to about 160 degrees.

The respective coupling pins 73, 74 pass through the openings 722, 723 such that they face a direction perpendicular to a tray insertion/drawing direction and couple to the tray 71. Each of the coupling pins 73, 74 are fastening tools such as screws, and may be formed of metal independently and configured such that it may be coupled to the tray 71. Also, each of the coupling pins 73, 74 may be integrally manufactured in a protrusion shape on the tray 71 via injection molding.

In the case where a partial region of the exterior cover 72 is pressed by a user, the openings 722, 723 may move along movement of the exterior cover. The first opening is an opening formed long in a first direction, and the second opening is an opening formed in a second direction. The openings 722, 723 may move in a predetermined direction by the shape of the openings and the inserted coupling pins 73, 74. Accordingly, the exterior cover 72 moves in a predetermined direction. The predetermined movement of the opening or the exterior cover may be called a trajectory. FIGS. 5B and 5C illustrate movement of the exterior cover. The mentioned trajectory may denote a predetermined movement of the opening or the exterior cover 72. Also, the trajectory may denote continuation of repeated movement trace of the exterior cover 72. A dotted line illustrated in FIG. 5C means the trajectory of the exterior cover 72. Also, the dotted line means a direction in which the first and second openings or recesses extend.

The tray 71 may have a cut surface 712 formed by cutting a portion of an upper surface. The cut surface 712 positioned in a portion of the upper surface may be provide a movement space of the exterior cover 72 such that the exterior cover 72 is spaced apart from the cut surface 712 and may pivot with respect to the cut surface 712. Also, the tray 71 may further have the cut portion, that is, a recess 713 caved in an insertion direction from the cut surface 712. Also, the exterior cover 72 may further have a protrusion 725 on a lower surface of a pressed portion. When the exterior cover 72 is pressed, the protrusion 725 may adhere to the recess 713 to prevent or inhibit excessive movement of the exterior cover 72.

The coupling structure may include one or more openings in a region of the tray 71 adjacent to the exterior cover 72, and may include one or more coupling pins (not shown) inserted to the openings and coupled to the exterior cover 72. Each of the coupling pins 73, 74 are fastening tools such as screws, and may be formed of metal independently and configured such that it may be coupled to the exterior cover 72. Also, each of the coupling pins 73, 74 may be integrally manufactured in a protrusion shape on the exterior cover 72 via injection molding.

Figure 6:
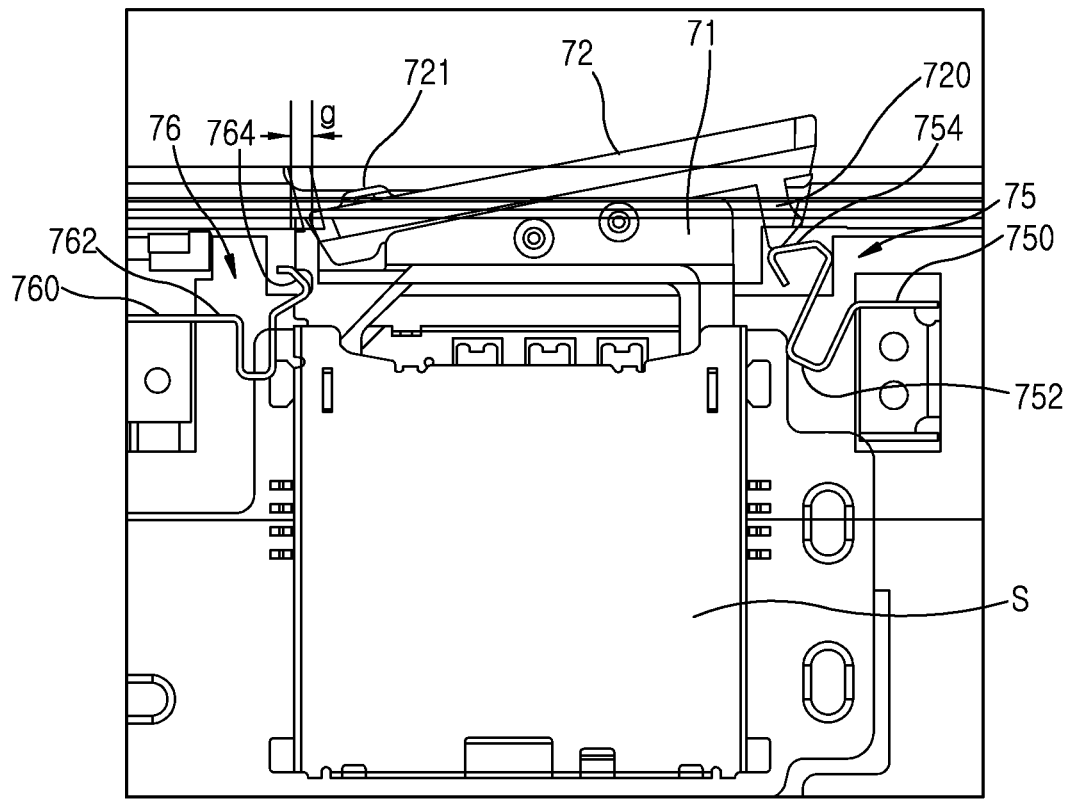
FIG. 6 is a view illustrating a state where an exterior cover of a card tray apparatus is pressed and maintenance of a closed state of the exterior cover has been released according to various embodiments of the present disclosure.

Referring to FIG. 6, the first hooking structure may include a first hooking portion 720 extending from the exterior cover 72, and a first retainer 75 disposed inside the entry of the electronic device. The first hooking portion 720 may be configured in a shape extending from a lower surface on the opposite side of the pressed portion of the exterior cover 72. The first retainer 75 may include an elastic body. The first retainer 75 is a member manufactured by bending a plate spring by a plurality of number of times, and maintains a closed state of the exterior cover 72 via coupling with the first hooking portion 720. FIG. 3 illustrates a closed state of the card tray module 70. Under the state of FIG. 3, detachment of the exterior cover 72 from the electronic device is prevented, and a connection state with the card socket is maintained.

Meanwhile, a second hooking structure together with the first hooking structure may be additionally disposed around the tray 71. The second hooking structure may inhibit or prevent the tray 71 from being detached from a device housing. Of course, during a closed state of the exterior cover 72, the second hooking structure maintains the closed state, and even when the exterior cover 72 is pressed and the closed state of the exterior cover 72 is released, the second hooking structure may maintain a closed state of the tray 71.

The second hooking structure may include a second hooking portion 710 that may be provided to the tray 71, and a second retainer 76 disposed on one side inside the apparatus housing. The second hooking portion 710 may be configured in a shape protruding in a side direction from the upper portion on one end of the tray 71. The second retainer 76 is a member manufactured by bending a plate spring by a plurality of number of times, and maintains a closed state of the tray 71 via coupling with the second hooking portion 710. Under the closed state, the tray 71 may prevent detachment from the electronic device, and maintain a connection state seated in the card socket.

One end of the first retainer 75 may be a fixed end 750 fixed to an injection structure provided to the inside of an opening, and the other end may be a free end 752 that cooperates with the first hooking portion 720. The free end 752 may be manufactured via bending, and may have a portion 754 bent toward the tray 71 at its end. The bent portion 754 may be a portion that cooperates with the first hooking portion 720, and may perform a sliding motion with the first hooking portion 720 depending on an insertion or drawing operation of the tray 71. The first retainer 75 may be formed of metal and may be manufactured using a plate spring independently. Also, the first retainer 75 may have a similar shape having a hooking portion, and may be manufactured integrally with a housing via injection molding.

One end of the second retainer 76 may be a fixed end 760 fixed to an injection structure provided to the inside of an opening, and the other end may be a free end 762 that cooperates with the second hooking portion 710. The free end 762 may be manufactured via bending, and has a portion 764 bent toward the tray 71 at its end. The bent portion 764 may be a portion that cooperates with the second hooking portion 710, and may perform a sliding motion with the second hooking portion 710 depending on an insertion or drawing operation of the tray 71. The second retainer 76 may be formed of metal and may be manufactured using a plate spring independently. Also, the second retainer 76 may have a similar shape having a hooking portion, and may be manufactured integrally with a housing via injection molding.

As illustrated in FIG. 6, when one end portion of the exterior cover 72 may be pressed, the exterior cover 72 moves with a trajectory. Simultaneously, the first hooking portion 720 may be detached from the first retainer 75. Under a closing maintenance release state of the exterior cover 71, a portion of the exterior cover 72 where the first hooking portion 720 may be positioned also serves as a knob for drawing the tray 71. That is, a user pulls a portion of the exterior cover 72 to draw the tray 71 from the electronic device.

The exterior cover 72 may further have a pressing protrusion 721 on an outer surface of a pressed one end portion. A pressing operation of the exterior cover 72 may be facilitated by the pressing protrusion 721.

Consequently, in the card tray module 70, after one end portion of the exterior cover may be pressed, the first hooking portion 720 may be detached from the first retainer 75, and subsequently, when a portion of the exterior cover 72 may be pulled, the tray 71 overcomes hooking of the second hooking portion 710 and may be detached from the connection socket S. Reversely, when the drawn exterior cover 72 may be continuously pushed in the connection socket direction, a card may be carried to the connection socket side and connected, and simultaneously, the first and second hooking portions 720 and 710 are coupled to the first and second retainers 75 and 76, so that a closed state of the card may be maintained in the connection socket.

As illustrated in FIG. 6, after a portion of the exterior cover 72 may be pressed, in case of drawing the tray from the housing, a gap g may be provided so that one end 724 of the exterior cover does not interfere on one end surface of the housing entry. In the case where the gap g does not exist, the exterior cover 72 interferes at the entry, so that an insertion/drawing operation may not be swiftly performed.

Figure 7:
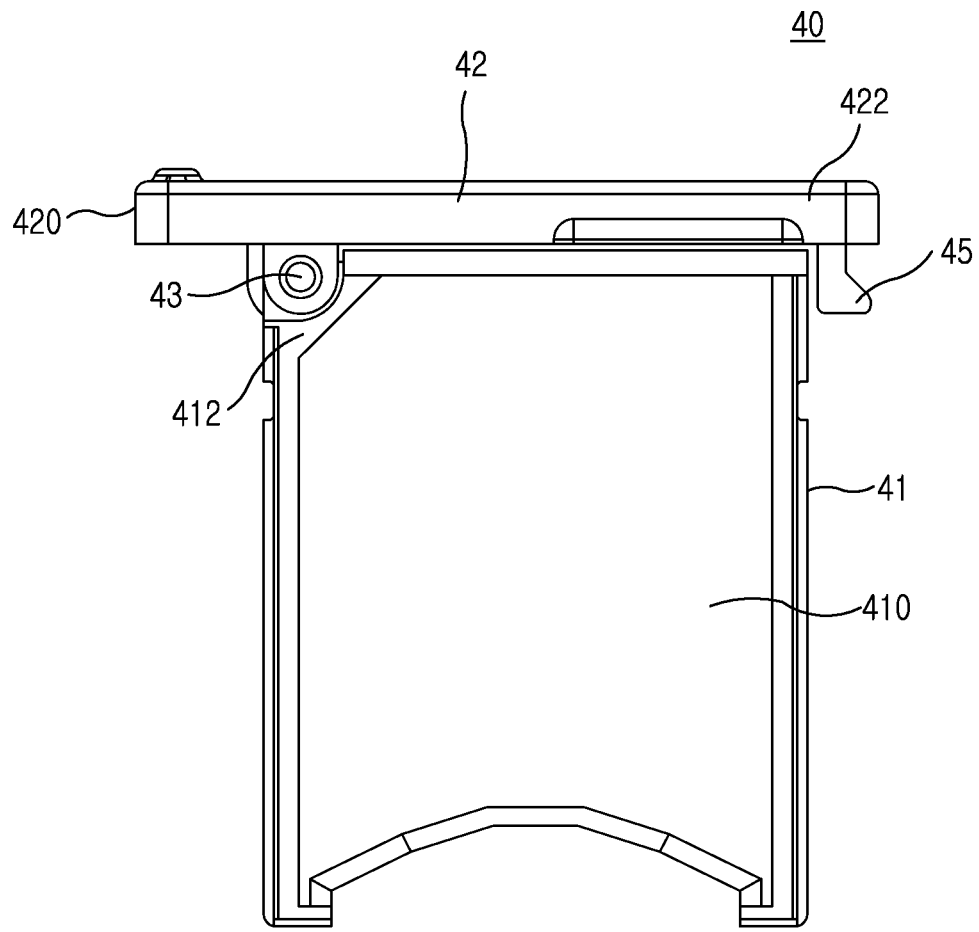
FIG. 7 is a view illustrating a state where an exterior cover and a tray of a card tray apparatus are coupled to each other according to various embodiments of the present disclosure.
Figure 8:
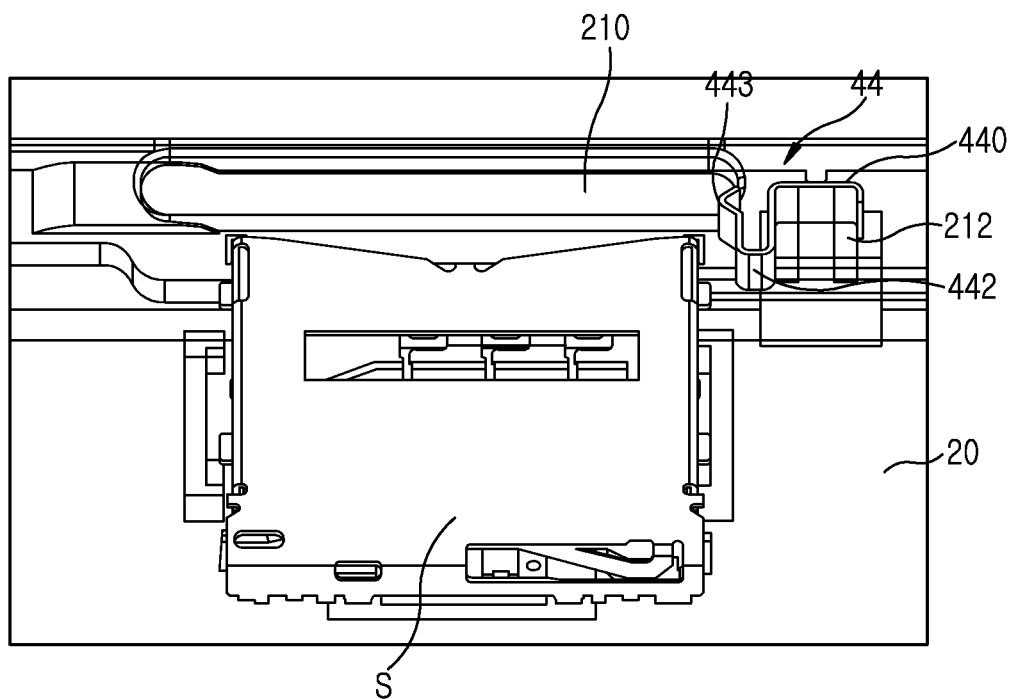
FIG. 8 is a view illustrating a retainer of a card tray apparatus according to various embodiments of the present disclosure.
Figure 9:
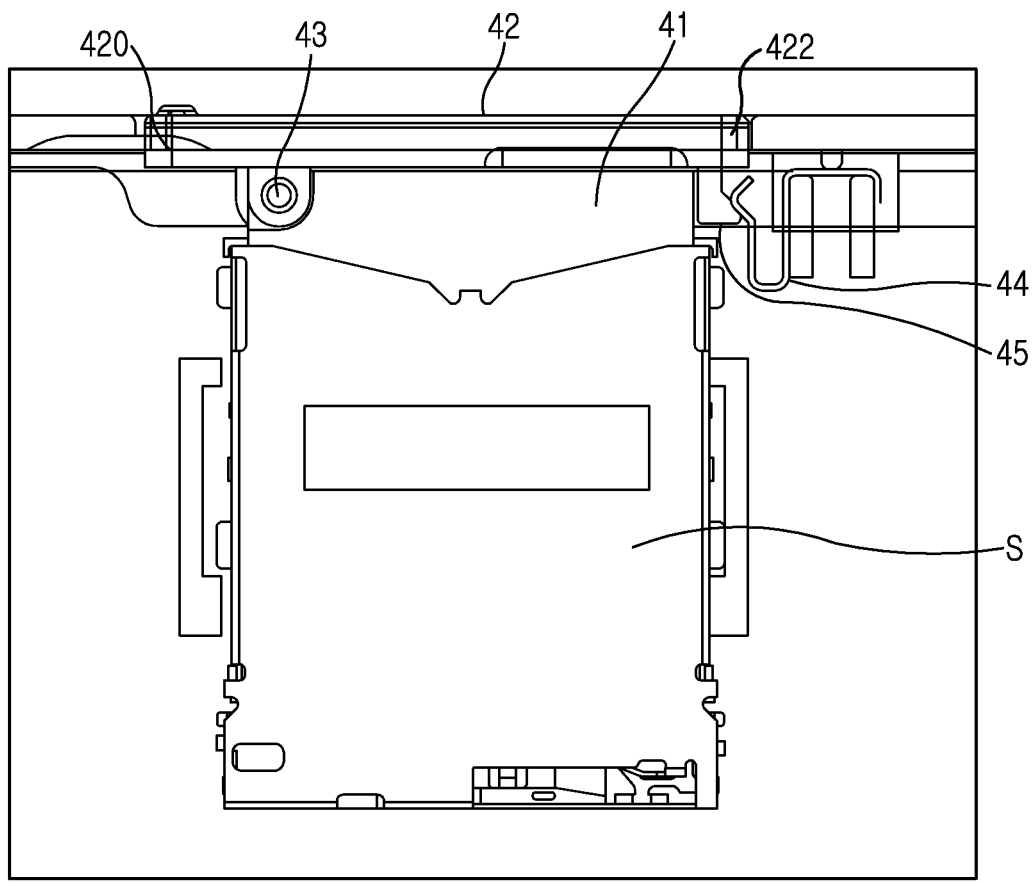
FIG. 9 is a view illustrating a fixed state of a card tray apparatus according to an embodiment of the present disclosure.

FIG. 7 is a front view illustrating a state where an exterior cover and a tray are coupled according to various embodiments of the present disclosure. FIG. 8 is a perspective view illustrating a retainer mount state according to various embodiments of the present disclosure. FIG. 9 is a front view illustrating a fixed state of a card tray apparatus according to various embodiments of the present disclosure.

Referring to FIGS. 7 to 9, the card tray module 40 includes a tray 41, an exterior cover 42, and hooking structures 44, 45. The tray 41 is a transfer member that safely receives a card and is inserted/drawn in a drawer manner to/from the electronic device together with the card.

The tray 41 has a receiving recess 410 corresponding to a card to receive the card safely. The card is not shown in the drawing. The card includes a SIM card or an SD card. The shape of the card is roughly rectangular, but a corner region on one side may be cut (a cut portion (not shown) is a triangle). Therefore, the card receiving recess 410 has a shape caved by a predetermined depth so that it may correspond to a card shape, and the corner region 412 on one side may have an uncaved shape. A hinge 43 rotatably connecting the tray 41 with the exterior cover 42 may be disposed inside the region (inside the card cut portion). The corner region on one side of the tray 41 may denote a corner region adjacent to the pressed portion of the exterior cover among two corner regions facing the exterior cover 42.

The hinge 43 may have a known pin shape, and may be provided to the corner region 412 on one side of the tray 41, and may have a cylindrical shape. Also, a hinge arm coupled to the hinge 43 may be provided to the exterior cover 42. Also, a rotational axis direction provided by the hinge 43 may be perpendicular to an insertion/drawing direction of the tray 41.

The exterior cover 42 may be connected to the tray 41 by the hinge 43 to open/close the opening 210 provided to the electronic device while the tray may be inserted. The exterior cover 42 performs a rotational motion like a seesaw around the hinge via the hinge 43. One end portion 420 may be a portion that is forcibly pressed by a user, and the other end portion 422 may operate as a portion of a hooking structure of the retainer.

The hooking structure may be a mechanism that maintains a fixed state of the tray depending on pressing of the exterior cover 42 exerted to the insertion/drawing direction of the tray, or releases a fixing maintenance state. The hooking structure includes a hooking portion 45 and a retainer 44 that cooperates with the hooking portion 45. The hooking portion 45 may be a hook-shaped protrusion extending from the inner surface of the exterior cover 42. The retainer 44 may include an elastic body.

The retainer 44 may be disposed in the inside of the opening 210 and cooperates with the hooking portion 45 to provide force maintaining a fixing state of the tray 41. The tray fixing state denotes a state of FIG. 9. Under the state of FIG. 9, detachment of the tray from the electronic device may be prevented, and a connection state with the card socket may be maintained.

One end of the retainer 44 may be a fixed end 440 fixed to an injection structure provided to the inside of an opening, and the other end may be a free end 442 that cooperates with the hooking portion. The free end 442 may be manufactured via bending, and has a portion 443 bent toward the tray 41 at its end. The bent portion 443 is a portion that cooperates with the hooking portion 45, and may perform a sliding motion with the hooking portion 45 depending on an insertion or drawing operation of the tray 41. The retainer 44 may be formed of metal and may be manufactured using a plate spring independently. Also, the retainer 44 may be manufactured in a similar shape integrally with the housing via injection molding.

Figure 10:
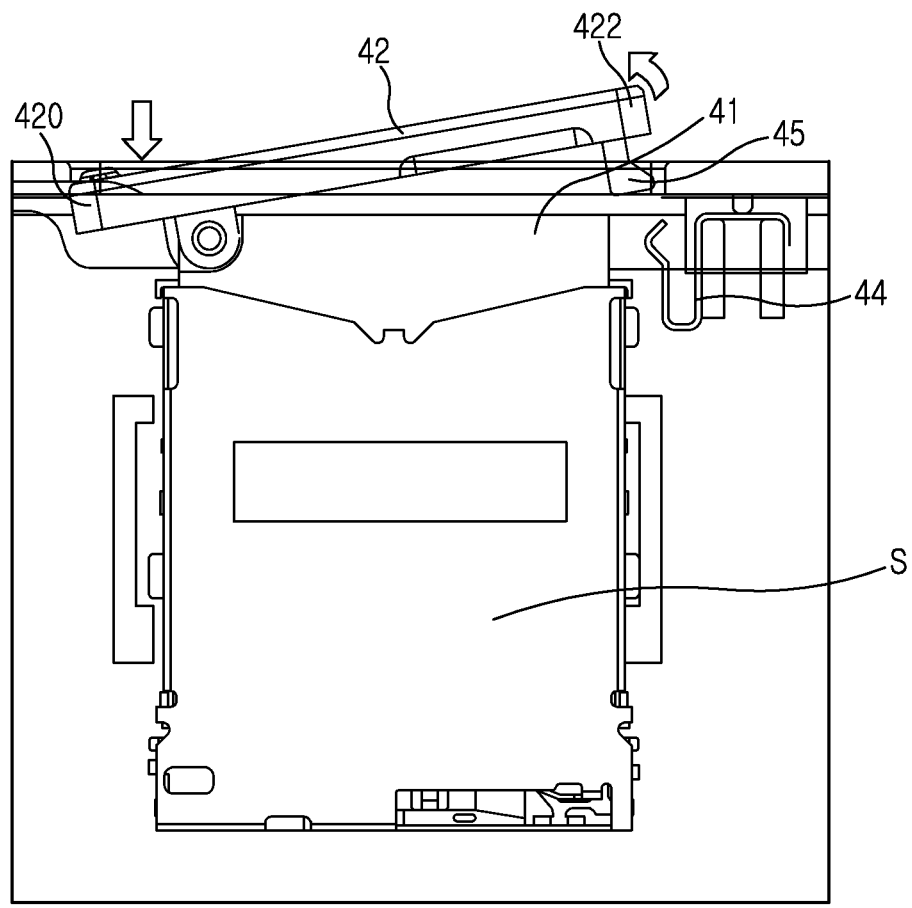
FIG. 10 is a view illustrating an exterior cover being pressed and rotated, so that fixing of a card tray is released according to various embodiments of the present disclosure.

FIG. 9 is a front view illustrating a fixed state of a card tray apparatus according to various embodiments of the present disclosure. FIG. 10 is a front view illustrating an exterior cover may be pressed and rotated, so that fixing of a card tray apparatus may be released according to various embodiments of the present disclosure. As illustrated in FIGS. 9 and 10, when one end portion 420 of the exterior cover 42 may be pressed, the other end portion 422 of the exterior cover rotates clockwise around the hinge 43. Simultaneously, the hooking portion 45 may be detached from the retainer 44. Under the state of FIG. 10, that is, the fixing release state of the tray 41, a portion of the exterior cover 42 where the hooking portion 45 is positioned also serves as a knob for drawing the tray 41. That is, a user pulls the portion to draw the tray 41 from the electronic device.

Figure 11A:
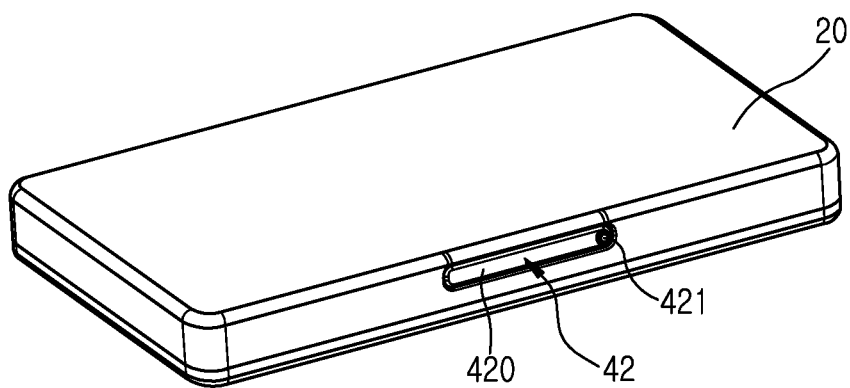
FIG. 11A is a view illustrating a state where an exterior cover is fixed to an electronic device according to various embodiments of the present disclosure.
Figure 11B:
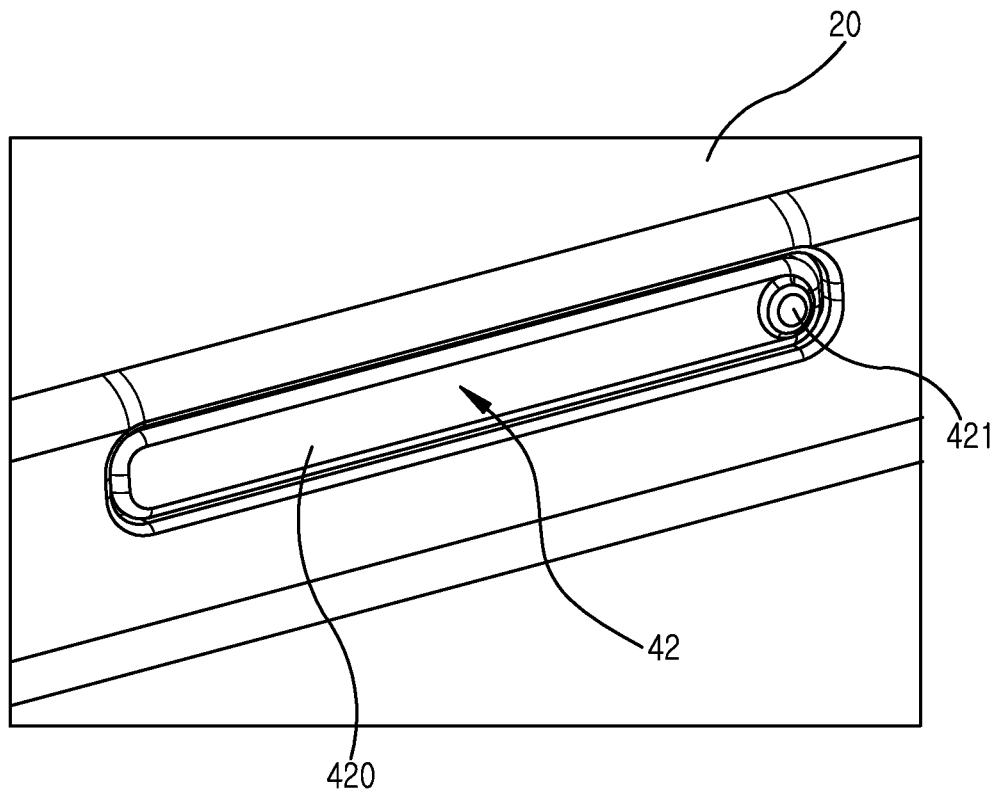
FIG. 11B is an enlarged view illustrating a portion of a state where an exterior cover is fixed to an electronic device according to various embodiments of the present disclosure.

As illustrated in FIGS. 11A and 11B, the exterior cover 42 may further have a pressing protrusion 421 on an outer surface of pressed one end portion. A pressing operation of the exterior cover 42 may be facilitated by the pressing protrusion 421.

Consequently, in the card tray 40, after one end portion 420 of the exterior cover may be pressed, the hooking portion 45 may be detached from the retainer 44, and subsequently, when a portion of the exterior cover 42 may be pulled, the tray 41 may be detached from the connection socket S. Reversely, when the drawn exterior cover 42 may be continuously pushed in the connection socket direction, a card may be carried to the connection socket side and connected, and simultaneously, the hooking portion 45 may be restricted to the retainer 44, so that detachment of the card from the connection socket may be prevented or inhibited.

A construction of a card tray apparatus adopted to an electronic device according to various embodiments of the present disclosure is described with reference to FIGS. 12 and 13.

Figure 12:
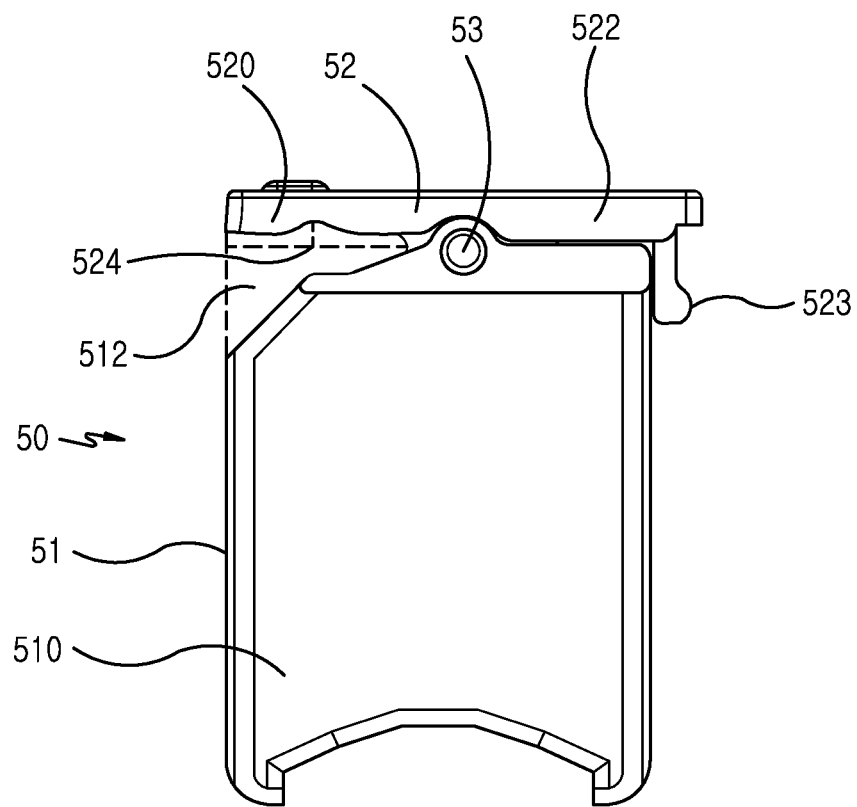
FIG. 12 is a top view illustrating a state where an exterior cover and a tray are coupled to each other according to various embodiments of the present disclosure.

FIG. 12 is a front view illustrating a card tray module 50 according to various embodiments of the present disclosure. FIG. 13 is a view illustrating a state where an exterior cover 52 of a card tray module 50 is pressed according to various embodiments of the present disclosure. A construction of the card tray module 50 adopted to an electronic device according to various embodiments of the present disclosure is described with reference to FIGS. 12 and 13.

The card tray module 50 includes a tray 51, an exterior cover 52, and cut portions 524, 512. The tray 51 may be a transfer member that safely receives a card and may be inserted/drawn in a drawer manner to/from the electronic device together with the card. The tray 51 has a receiving recess 510 corresponding to a card to receive the card safely. The card is not shown in the drawing. The card includes a SIM card or an SD card. The shape of the card may be roughly rectangular, but a corner region on one side is cut (a cut portion may have a triangular shape). The card receiving recess 510 has a shape caved by a predetermined depth so that it may correspond to a card shape, and the corner region 512 on one side has a cut region 512. The cut region 512 denotes a corner region adjacent to the pressed portion of the exterior cover 52 among two corner regions facing the exterior cover 52. The cut region 512 provides a rotational space of the exterior cover together with a cut region of the exterior cover which will be described later. The cut region 512 has a shape having a plurality of planes.

The hinge 53 may have a known pin shape and may be provided to an intermediate region at the top end of the tray and has a cylindrical shape. The top end of the tray may be a region connected with the exterior cover. The exterior cover may be rotatably coupled to the top end of the tray by the hinge. Also, a hinge arm coupled to the hinge 53 may be provided to an intermediate point of the exterior cover. Also, a rotational axis direction provided by the hinge 53 may be perpendicular to an insertion/drawing direction of the tray 51.

The exterior cover 52 is connected to the tray 51 by the hinge 53 to open/close the opening 210 provided to the electronic device when the tray may be inserted. The exterior cover 52 performs a rotational motion like a seesaw around the hinge h via the hinge 53. One end portion 520 may be a portion forcibly pressed by a user, and the other end portion 522 operates as a portion of a knob during a drawing operation. A cut region 524 for a rotation space of the exterior cover 52 may be provided to a lower surface of the one end portion 520 of the exterior cover. The cut portion 524 provided to the exterior cover provides the rotation space of the exterior cover 52 together with the cut region 512 of the tray. The cut region 524 has a plurality of inclined surfaces. When the exterior cover 52 may be fixed to the housing, the one end portion 520 of the exterior cover and the corner region on one side of the tray 51 are separated by the cut regions 512 and 524. When the exterior cover 52 rotates, the cut regions 512 and 524 adhere to each other. A hooking portion 523 may be provided to the other end portion 522 of the exterior cover.

Figure 13:
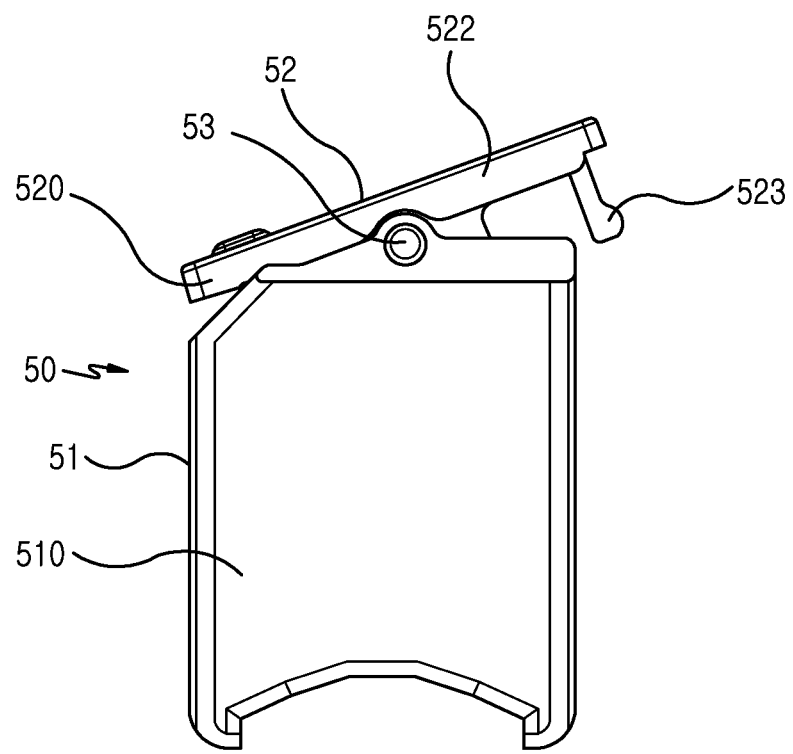
FIG. 13 is a top view illustrating a state where an exterior cover is pressed or rotated relative to a tray according to an embodiment of the present disclosure.

An adhered state of the cut region 524 of the exterior cover and the cut region 512 of the tray is illustrated in FIG. 13.

A construction of a card tray apparatus adopted to an electronic device according to various embodiments of the present disclosure is described with reference to FIGS. 14 to 16B.

Figure 14:
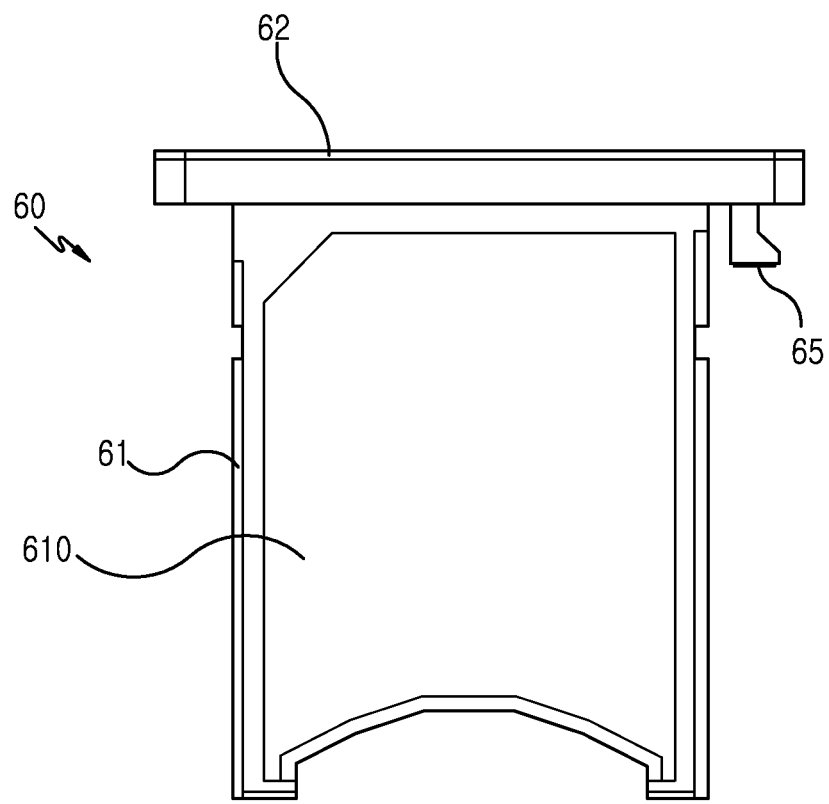
FIG. 14 is a view illustrating an exterior cover and a tray according to various embodiments of the present disclosure.
Figure 15:
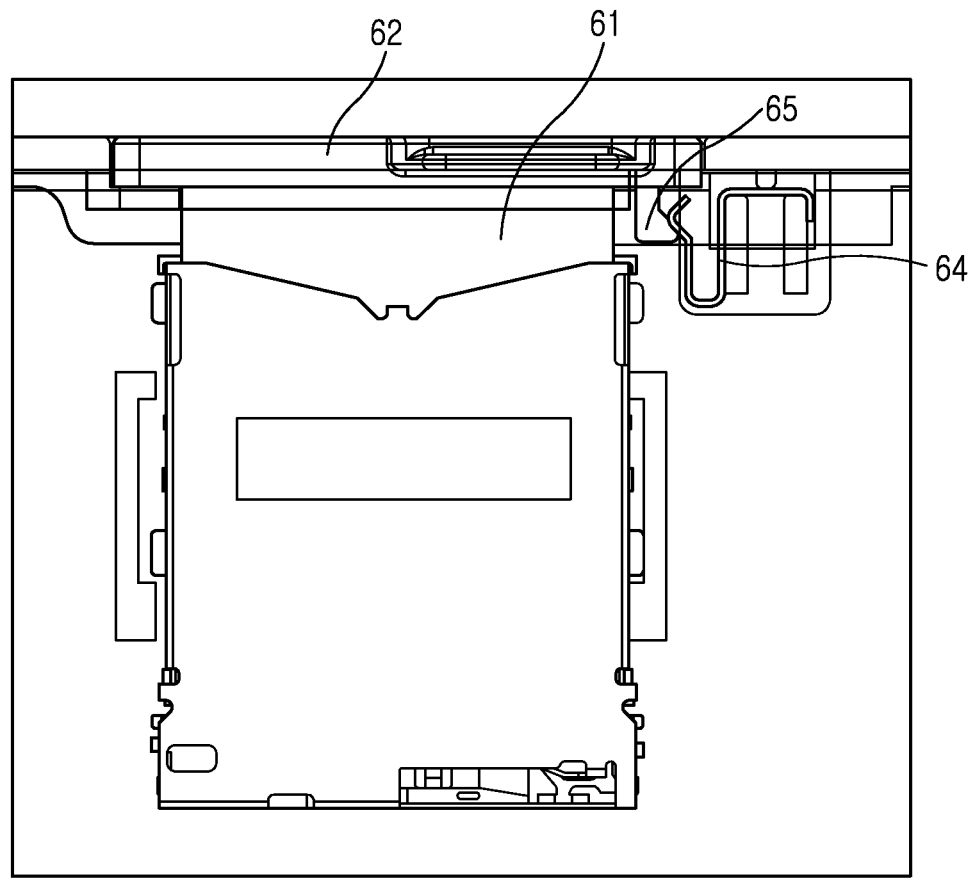
FIG. 15 is a view illustrating a mounted state of a card tray apparatus according to various embodiments of the present disclosure, and is a view illustrating a fixed state of the tray.

FIG. 14 is a front view illustrating an exterior cover and a tray of a card tray apparatus according to various embodiments of the present disclosure, and FIG. 15 is a front view illustrating a mounted state of a card tray apparatus according to various embodiments of the present disclosure, and is a view illustrating a fixed state of the tray. FIG. 16 is a front view illustrating an exterior cover fixed to an opening of a housing according to various embodiments of the present disclosure. A construction of a card tray module 60 adopted to an electronic device according to various embodiments of the present disclosure is described. The card tray includes a tray, an exterior cover, and a hooking structure. Since a construction of the hooking structure is the same as that of the hooking structure illustrated in FIGS. 7 to 11, detailed description thereof is omitted.

The tray 61 may be a transfer member that safely receives a card and may be inserted/drawn in a drawer manner to/from the electronic device together with the card. The tray 61 has a receiving recess 610 corresponding to a card to receive the card safely. The card is not shown in the drawing. The card may include a SIM card or an SD card. A corner region on one side of the card may be cut depending on a card shape. Therefore, the card receiving recess 610 has a shape caved by a predetermined depth so that it may correspond to a card shape.

The exterior cover 62 may be integrally configured with the tray 61 to open/close an opening formed in the electronic device. The exterior cover 62 may be integrally formed with the tray 61 via coupling, and may be integrally manufactured via injection molding.

Since the hooking structure has been already described in detail, description thereof is omitted. A reference numeral 64 may be a retainer, and a reference numeral 65 may be a hooking portion.

Figure 16A:
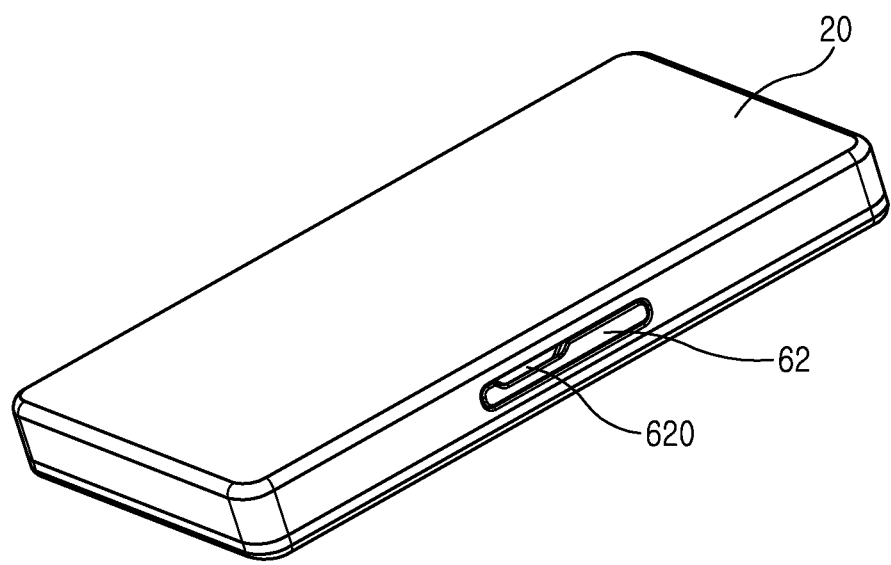
FIG. 16A is a view illustrating a state where an exterior cover is fixed to an electronic device according to various embodiments of the present disclosure.
Figure 16B:
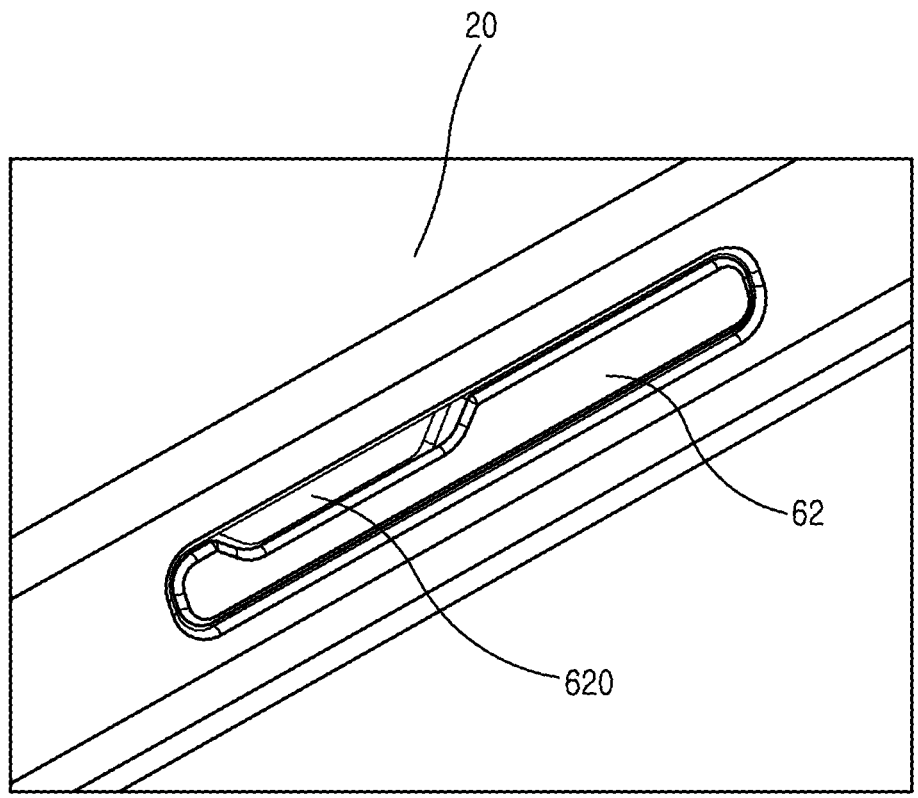
FIG. 16B is an enlarged view illustrating a portion of a state where an exterior cover is fixed to an electronic device according to various embodiments of the present disclosure.

As illustrated in FIGS. 16A and 16B, the card tray module 60 has a recess 620 in a partial region of an outer surface of the exterior cover 62. The recess 620 may be formed to draw the exterior cover 62 fixed to the opening of the electronic device to the outside. The recess 620 may be formed in a size to which a user's nail may be inserted.

According to the above construction, a user may insert his nail to the recess 620 to draw the tray 61, and push the exterior cover 62 to the inside of the electronic device to allow the tray 61 to be inserted to the inside of the electronic device, thereby seating a card in a connection socket.

It will be appreciated that embodiments of the present disclosure according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present disclosure.

Accordingly, embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

Although the disclosure has been shown and described with reference to certain exemplary embodiments thereof, it will be understood by those skilled in the art that various changes in form and details may be made therein without departing from the spirit and scope of the disclosure as defined by the appended claims and their equivalents. Therefore, the scope of the present disclosure should not be limited to the above-described embodiments but should be determined by not only the appended claims but also the equivalents thereof.

What is claimed is:

1. An electronic device comprising:
   a housing comprising an opening;
   a tray inserted within the opening of the housing, the tray comprising a space for receiving a card;
   an exterior cover movably coupled to the tray; and
   a locking structure comprising a first hooking structure disposed inside the housing, the locking structure configured to transition between a locked state maintaining a closed state of the exterior cover and an unlocked state releasing the exterior cover, transitioning of the locking structure being caused by a pressing of the exterior cover, wherein the first hooking structure comprises:
   a first hooking portion extending from an inner surface of the exterior cover; and
   a first retainer for maintaining a closed state of the exterior cover using coupling with the first hooking portion,
   wherein the first retainer is configured using a plate spring manufactured independently, or integrally formed with the housing via injection molding.

2. The electronic device of claim 1, wherein when the exterior cover is pressed, the exterior cover is moved such that it has a trajectory in the tray by a coupling structure.

3. The electronic device of claim 2, wherein the coupling structure comprises:
   one or more openings provided to the exterior cover and enabling trajectory movement of the exterior cover; and
   one or more coupling pins provided to the tray and inserted to the openings, respectively.

4. The electronic device of claim 3, wherein the openings are formed to have a space between the openings having an interval, and having a long and bent configuration.

5. The electronic device of claim 3, wherein each coupling pin is coupled such that it faces a direction perpendicular to a tray insertion/drawing direction, and the tray is one of: independent formed and coupled to the tray; and integrally formed with the tray via injection molding.

6. The electronic device of claim 2, wherein an upper surface of the tray is partially cut to provide a movement space of the exterior cover.

7. The electronic device of claim 6, wherein the tray further has a recess caved in an insertion direction in the cut portion, and a protrusion is formed on a backside of pressed one end portion of the exterior cover, and when the exterior cover is pressed, the protrusion inhibits movement via adherence to the recess.

8. The electronic device of claim 2, wherein with the exterior cover pressed, a portion of the exterior cover positioned in an opposite direction of the pressed portion also serves as a knob for drawing the tray.

9. The electronic device of claim 2, wherein the exterior cover further has a pressing protrusion protruding to an outside on an outer surface of the pressed portion.

10. The electronic device of claim 1, wherein the locking structure further comprises a second hooking structure inhibiting detachment of the tray,
    wherein the second hooking structure comprises:
    a second hooking portion formed on one side at an upper end of the tray; and
    a second retainer preventing detachment of the tray via coupling with the second hooking portion,
    wherein the second retainer is configured using a plate spring that is one of manufactured independently, and integrally formed with the housing via injection molding.

11. The electronic device of claim 1, wherein a gap is prepared between an end portion of the exterior cover and one end of a tray entry with the exterior cover pressed, so that interference with the one end by movement of the exterior cover is inhibited.

12. An electronic device comprising:
    a tray inserted or drawn to or from an inside via an opening of a housing of the electronic device, and comprising a space for receiving a card;
    an exterior cover rotatably coupled to a partial region of the tray by a hinge; and a first hooking structure disposed in an inside of the electronic device, and maintaining a fixed state of the tray, or releasing a fixed maintenance state of the tray depending on pressing of the exterior cover in an insertion/drawing direction of the tray, wherein the first hooking structure comprises:
a first hooking portion extending from an inner surface of the exterior cover; and
a first retainer for maintaining a closed state of the exterior cover using coupling with the first hooking portion,
wherein the first retainer is configured using a plate spring manufactured independently, or integrally formed with the housing via injection molding.

13. The electronic device of claim 12, wherein the hinge is disposed in a corner region on one side of the tray, and disposed in a portion of the tray inside a region of a cut portion of a card put in the tray, wherein the hinge faces a direction perpendicular to an insertion/drawing direction of the tray.

14. An electronic device comprising:
a tray inserted or drawn via an opening provided to a housing and comprising a space for receiving a card;
an exterior cover rotatably coupled to an upper end of the tray by a hinge, and at least a portion of which is pressed, so that another portion positioned in an opposite direction of the at least portion is detached;
a first hooking portion extending from an inner surface of the exterior cover; and
a first retainer for maintaining a closed state of the exterior cover using coupling with the first hooking portion,
wherein the first retainer is configured using a plate spring manufactured independently, or integrally formed with the housing via injection molding.

15. The electronic device of claim 14, wherein the hinge is positioned on an intermediate portion at an upper end of the tray and moves like a seesaw.

16. The electronic device of claim 15, wherein a partial region of the tray is cut in a predetermined shape to provide a rotational space of the exterior cover, and the pressed portion of the exterior cover cuts a portion of a backside to extend the rotational space of the exterior cover, and a cut surface comprises a plurality of inclined planes.

17. An electronic device comprising:
a tray inserted or drawn via an opening provided to the electronic device, wherein the tray comprises a space for receiving a card;
an exterior cover having a recess in a partial region of its outer surface and integrally formed with the tray to open/close the opening; and
a first hooking structure disposed in an inside of a housing of the electronic device, and maintaining a closed state of the tray or releasing a closed maintenance state of the tray depending on insertion/drawing of the tray,
wherein the first hooking structure comprises:
a first hooking portion extending from an inner surface of the exterior cover; and
a first retainer for maintaining a closed state of the exterior cover using coupling with the first hooking portion,
wherein the first retainer is configured using a plate spring manufactured independently, or integrally formed with the housing via injection molding.

18. The electronic device of claim 17, wherein the exterior cover is integrally formed with the tray via injection molding.

19. The electronic device of claim 18, wherein the recess is configured in a sufficient size such that a user's nail is inserted to the recess.

20. An electronic device comprising:
a portable electronic device housing;
a recess formed in one side of the housing;
a socket positioned inside the recess;
a tray inserted or drawn to or from the socket inside the recess and comprising a space for receiving a card;
a tray cover being one of attached and bound to the tray, the tray cover being exposed to one side of the housing when the tray is inserted to the socket; and
a first binder gripping at least a portion of the tray cover to retain the same inside the socket,
wherein the tray comprises two pins, the tray cover comprises openings corresponding to the two pins, respectively, and greater than the two pins, and the two pins are movably fit inside the openings.

21. The electronic device of claim 20, wherein the openings comprise:
a first opening formed long in a first direction; and
a second opening formed long in a second direction different from the first direction.

22. The electronic device of claim 21, wherein the first direction and the second direction define an angle therebetween within a range of between 91 degrees and about 179 degrees inclusive.

23. The electronic device of claim 22, wherein the first direction and the second direction define an angle therebetween within a range of about 120 degrees and about 160 degrees inclusive.

* * * * *